(12) United States Patent
Weingartner et al.

(10) Patent No.: US 10,962,617 B2
(45) Date of Patent: Mar. 30, 2021

(54) METHODS AND APPARATUS FOR SCAN TIME REDUCTIONS IN MAGNETIC RESONANCE IMAGING USING OUTER VOLUME SUPRESSION

(71) Applicants: REGENTS OF THE UNIVERSITY OF MINNESOTA, Minneapolis, MN (US); RUPRECHT-KARLS UNIVERSITY OF HEIDELBERG, Heidelberg (DE)

(72) Inventors: Sebastian Weingartner, Mannheim (DE); Steen Moeller, St. Louis Park, MN (US); Mehmet Akcakaya, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 155 days.

(21) Appl. No.: 15/947,167

(22) Filed: Apr. 6, 2018

(65) Prior Publication Data

US 2018/0292487 A1    Oct. 11, 2018

Related U.S. Application Data

(60) Provisional application No. 62/482,758, filed on Apr. 7, 2017.

(51) Int. Cl.
*G01R 33/483* (2006.01)
*G01R 33/561* (2006.01)

(Continued)

(52) U.S. Cl.
CPC ..... *G01R 33/4835* (2013.01); *G01R 33/4616* (2013.01); *G01R 33/4625* (2013.01);
(Continued)

(58) Field of Classification Search
CPC ............. G01R 33/561; G01R 33/5611; G01R 33/56325; G01R 33/56366;
(Continued)

(56) References Cited

U.S. PATENT DOCUMENTS

2011/0144474 A1* 6/2011 Ouwerkerk ............ A61B 5/055
    600/410
2012/0119740 A1* 5/2012 Takahashi ............... G01R 33/48
    324/309

(Continued)

OTHER PUBLICATIONS

Coristine et al. "Combined T2-Preparation and Two-Dimensional Pencil-Beam Inner Volume Selection" Magnetic Resonance in Medicine 74:529-536 (2015).

(Continued)

*Primary Examiner* — Melissa J Koval
*Assistant Examiner* — Dustin R Dickinson
(74) *Attorney, Agent, or Firm* — Quarles & Brady LLP

(57) ABSTRACT

Methods for fast magnetic resonance imaging ("MRI") using a combination of outer volume suppression ("OVS") and accelerated imaging, which may include simultaneous multislice ("SMS") imaging, data acquisitions amenable to compressed sensing reconstructions, or combinations thereof. The methods described here do not introduce foldover artifacts that are otherwise common to reduced field-of-view ("FOV") techniques.

20 Claims, 6 Drawing Sheets

(51) Int. Cl.
*G01R 33/46* (2006.01)
*G01R 33/563* (2006.01)

(52) U.S. Cl.
CPC ..... *G01R 33/4633* (2013.01); *G01R 33/4836* (2013.01); *G01R 33/4838* (2013.01); *G01R 33/561* (2013.01); *G01R 33/5611* (2013.01); *G01R 33/56325* (2013.01); *G01R 33/56366* (2013.01)

(58) Field of Classification Search
CPC ............ G01R 33/4816; G01R 33/4625; G01R 33/4633; G01R 33/4833; G01R 33/4835; G01R 33/4838; G01R 33/4836
See application file for complete search history.

(56) References Cited

U.S. PATENT DOCUMENTS

| | | | | |
|---|---|---|---|---|
| 2013/0271133 | A1* | 10/2013 | Snyder | G01R 33/4824 324/309 |
| 2013/0342206 | A1* | 12/2013 | Ugurbil | G01R 33/4835 324/309 |
| 2014/0225612 | A1* | 8/2014 | Polimeni | G01R 33/5611 324/309 |
| 2015/0309142 | A1* | 10/2015 | Li | G01R 33/5611 324/309 |
| 2016/0231409 | A1* | 8/2016 | Taviani | G01R 33/5611 |
| 2017/0003363 | A1* | 1/2017 | Rosen | G01R 33/445 |
| 2017/0343635 | A1* | 11/2017 | Salerno | G01R 33/5601 |

OTHER PUBLICATIONS

Smith et al. "Reduced Field of View MRI with Rapid, B1-Robust Outer Volume Suppression" Magnetic Resonance in Medicine 67:1316-1323 (2012).

Stab et al. "High Resolution Myocardial First-Pass Perfusion Imaging With Extended Anatomic Coverage" Journal of Magnetic Resonance Imaging 39:1575-1587 (2014).

Weingärtner et al. "Feasibility of Ultra-high Simultaneous Multi-slice and In-plane Accelerations for Cardiac MRI Using Outer Volume Suppression and Leakage-Blocking Reconstruction" (2018) 3 papges.

Weingärtner, Sebastian, Steen Moeller, Sebastian Schmitter, and Mehmet Akçakaya. "Highly-Accelerated Simultaneous Multi-Slice CMR Using Outer Volume Suppression: Time-Efficient Characterization of Cardiac Function In A Single Breath-hold." Proceedings of the Society for Cardiovascular Magnetic Resonance (2018).

Yang et al. "Reduced field-of-view stack-of-spirals enables high spatiotemporal resolution 3D perfusion imaging" Journal of Cardiovascular Magnetic Resonance 2016, 18(Suppl 1):P325, 3 pages. http://www.jcmr-online.com/content/18/S1/P325.

* cited by examiner

METHODS AND APPARATUS FOR SCAN TIME REDUCTIONS IN MAGNETIC RESONANCE IMAGING USING OUTER VOLUME SUPRESSION

CROSS-REFERENCE TO RELATED APPLICATIONS

This application claims the benefit of U.S. Provisional Patent Application Ser. No. 62/482,758, filed on Apr. 7, 2017, and entitled "METHODS AND APPARATUS FOR SCAN TIME REDUCTION IN MAGNETIC RESONANCE IMAGING USING OUTER VOLUME SUPPRESSION," which is herein incorporated by reference in its entirety.

STATEMENT REGARDING FEDERALLY SPONSORED RESEARCH

This invention was made with government support under HL111410 and EB015894 awarded by National Institutes of Health. The government has certain rights in the invention.

BACKGROUND

In magnetic resonance imaging ("MRI"), a rectangular field-of-view ("FOV") covering an entire cross-section of the body is typically excited, even if the region-of-interest ("ROI") in the subject's body is relatively small. In some imaging applications, such as body imaging applications including cardiac imaging, this can be problematic where the field-of-view extends up to approximately 35 cm, even though the heart itself covers only a fraction (e.g., 25-33 percent) of the FOV.

Several techniques have been proposed to suppress signal outside the ROI. These include approaches for spatially selective excitation (e.g., inner volume selection) or for suppression of tissue outside the ROI (e.g., outer volume suppression, or "OVS"). However, OVS is commonly not effective enough to allow for a reduction in the FOV because the residual signal outside the ROI creates fold-over artifacts.

First pass myocardial perfusion imaging is the clinical gold-standard for detection of myocardial ischemia. It is commonly performed with two to four short-axis slices acquired every RR interval with T1-weighted contrast using saturation-recovery. However, limited left-ventricular coverage and coarse spatiotemporal resolutions are main factors compromising diagnostic image quality. To improve this, highly-undersampled 2D or 3D imaging techniques have been proposed, often relying on the utilization of spatiotemporal correlations. This necessitates modeling of the temporal dynamics, breath-holding, or motion correction. An alternative is to use simultaneous multislice or multiband ("MB") imaging to acquire multiple slices simultaneously. The SNR reduction and leakage artifacts in cardiac imaging may be mitigated by suppression of extra-cardiac tissue. Such suppression has recently shown potential in 3D stack-of-spirals perfusion imaging.

Cine MRI is routinely used in most cardiac MRI protocols for assessment of cardiac function. However, covering the entire ventricle necessitates long scan-times with conventional methods, leading to increased patient discomfort and associated health-care costs. SMS has been proposed for scan acceleration, by simultaneously exciting multiple slices and reconstructing these using coil information. The use of band shifts, as in CAIPIRINHA, has improved noise amplification in SMS imaging. However, unfavorable coil geometries in cardiac applications limit the SMS acceleration compared to neuroimaging.

SUMMARY OF THE DISCLOSURE

The present disclosure addresses the aforementioned drawbacks by providing a method for acquiring images from multiple different slices in a subject using a magnetic resonance imaging (MRI) system. The MRI system is controlled to acquire data in a plurality of different slices in a subject using a pulse sequence that includes an outer volume suppression ("OVS") module and an accelerated imaging module that is performed after the OVS module. The OVS module contains at least one radio frequency ("RF") pulse that suppresses magnetic resonance signals in one or more outer volume regions in the plurality of different slices. The accelerated imaging module provides an accelerated data acquisition along at least one direction. Images of the plurality of slices are reconstructed from the acquired data.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here are methods for fast magnetic resonance imaging ("MRI"), using a combination of outer volume suppression ("OVS") and accelerated imaging, which may include simultaneous multislice ("SMS") imaging, data acquisitions amenable to compressed sensing reconstructions, or combinations thereof. Advantageously, the methods described in the present disclosure allow for reducing scan time without introducing fold-over artifacts that are common to reduced field-of-view ("FOV") techniques. In some embodiments, the OVS can be achieved using multiband RF pulses to simultaneously saturate signals in the outer regions of a plurality of different slices. In some other embodiments, the OVS can be achieved using adiabatic RF pulses to tip-down signals in the outer regions followed by a slab selective RF pulse to restore the signal in the center region of a plurality of different slices. In still other embodiment, the OVS can be achieved by incorporating spatially selective RF pulses into a magnetization preparation module, such as a T2-preparation module.

Figure 1:
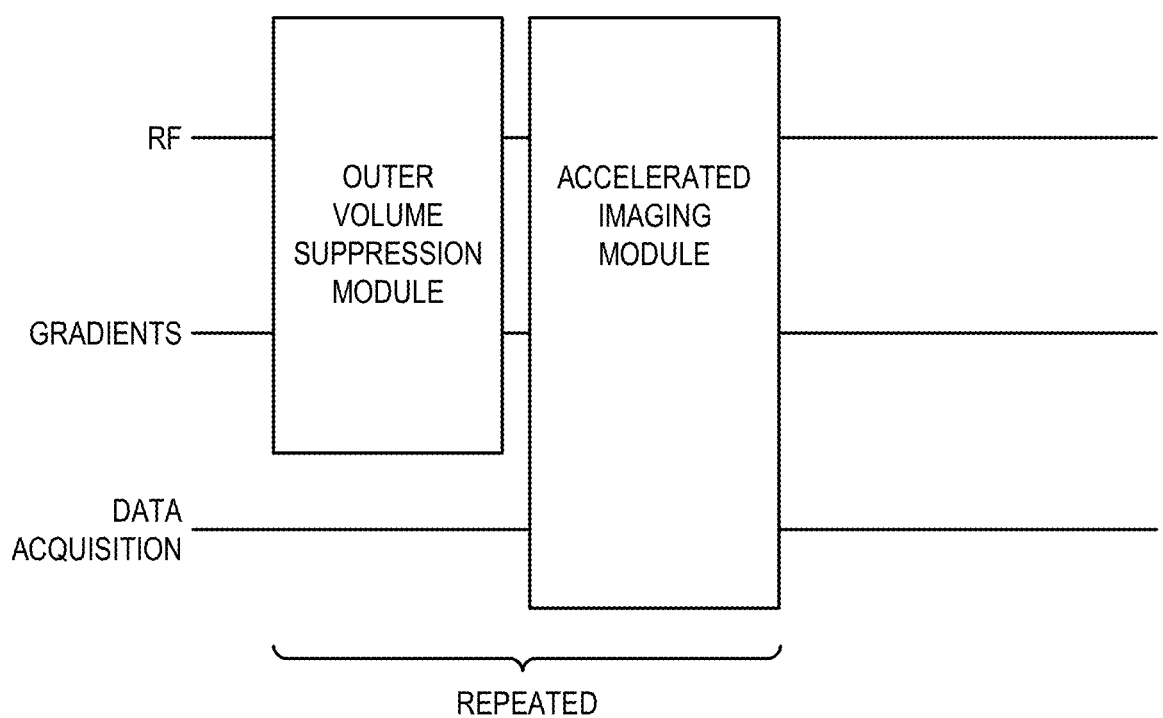
FIG. 1 is an example of a pulse sequence that interleaves a multiband outer volume suppression module with a simultaneous multislice imaging module.

As shown in FIG. 1, the methods described in the present disclosure generally include interleaving an OVS module 100 with an accelerated imaging module 102. As mentioned above, the OVS module can include multiband OVS RF pulses, spatially selective adiabatic OVS RF pulses, a magnetization preparation module that include spatially selective OVS RF pulses (e.g., a T2-preparation module), or combinations thereof. The OVS module 100 can also include one or more magnetic field gradients, such as gradients that may be used to implement the spatially selective RF pulses. The accelerated imaging module 102 can include an SMS imaging module containing one or more multiband RF pulses that simultaneously excite a plurality of different slices; a parallel imaging module, in which data acquisition is accelerated by way of in-plane undersampling; a compressed sensing module, in which subsets of data are acquired, such as random subset of data; or combinations thereof.

Figure 2:
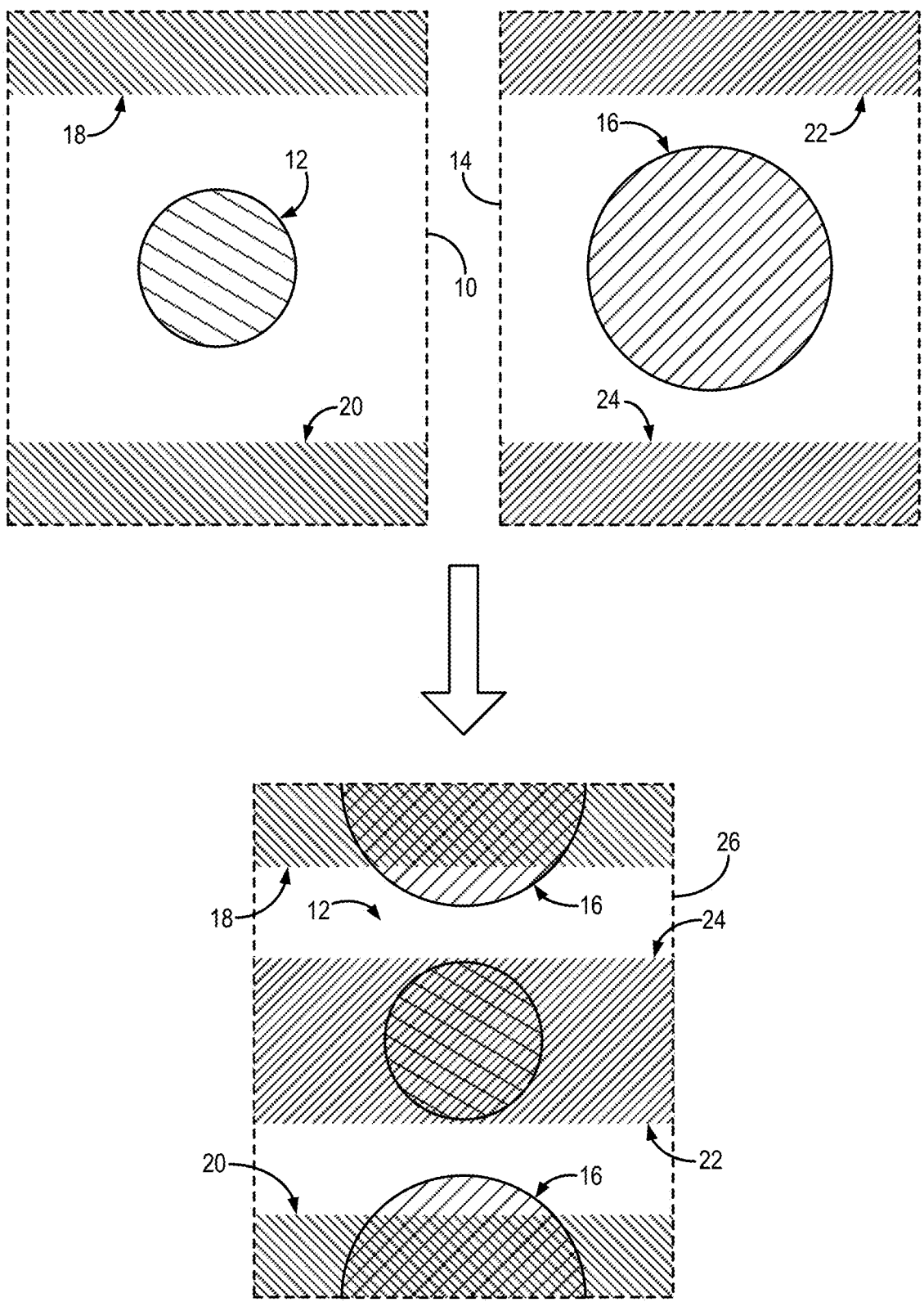
FIG. 2 illustrates slice aliasing occurring with a simultaneous multislice acquisition, and in which multiband outer volume suppression is used and applied such that signals from a region-of-interest in one slice are overlapped with suppressed regions from adjacent slices to minimize inter-slice signal leakage.

In SMS, multiple slices are simultaneously excited, so that the FOV is shared among multiple images. OVS can be used to minimize the inter-slice leakage by overlaying a suppressed image region with the ROI of another slice. In this way, inter-slice leakage can be minimized and higher acceleration factors can be achieved without introducing fold-over artifacts. A non-limiting example of this is illustrated in FIG. 2 for two simultaneously excited slices. In this example, a first slice 10 containing an ROI 12 and a second slice 14 containing an ROI 16 are simultaneously imaged. In the first slice 10, outer volume suppression is achieved in a first outer region 18 and a second outer region 20, and in the second slice 14, outer volume suppression is achieved in a third outer region 22 and a fourth outer region 24. Because the first slice 10 and the second slice 14 are simultaneously imaged, signals from the second slice 14 will be aliased onto the same field-of-view as the first slice 10, as shown in the aliased image 26.

In this aliased image 26, the aliased signals from the ROI 16 in the second slice 14 can be shifted to be spatially separated from the ROI 12 in the first slice 10 by imposing a field-of-view shift on the aliased signals (e.g., using CAIPIRINHA, blipped-CAIPIRINHA). In the same way, the outer volume suppression applied to the third outer region 22 and the fourth outer region 24 in the second slice 14 can be made to overlap with the ROI 12 in the first slice 10, as seen in the aliased image 26.

In some implementations, a multiband saturation that simultaneously tips-down signal on both sides of the ROI in a plurality of different slices can be used. As an example, the ROI could contain the heart and the multiband saturation can be applied to simultaneously tip down signals anterior and posterior to the heart (e.g., in the chest and back). Both sides are excited simultaneously using a multiband pulse to minimize the preparation duration. This scheme is particularly useful for imaging sequences with continuous imaging, throughout an extended time-period, such as cardiac cine MRI.

In some other implementations, a combination of an adiabatic non-selective tip-down with a selective tip-up (or selective tip-down with adiabatic non-selective tip-up) can be used. As one non-limiting example, the selective pulse can be implemented as a highly asymmetric slab-selective pulse to minimize $T_2^*$ dephasing. This can be useful for imaging applications such as perfusion imaging where specific absorption rate ("SAR") is not as concerning as it may be if using the adiabatic RF pulses for cine MRI. The spatially selective RF pulses can also be used in combination with other preparation modules, such as a $T_2$ preparation module, which may be beneficial for imaging applications such as imaging the coronary arteries.

In the methods described in the present disclosure, a rectangular, or other shaped, ROI can be selected, and the dimension in which signal suppression is applied is aligned with the phase-encoding direction to minimize inter-slice leakage. Imaging can be performed as 2D or 3D. In 3D imaging, multiple 3D-encoded thin slabs can be acquired. The methods described in the present disclosure can also be used in combination with compressed sensing or parallel imaging to further reduce scan-time. Compressed sensing can be particularly advantageous because the outer volume suppression implemented in the methods described in the present disclosure increases the sparsity of the acquired data.

Figure 3:
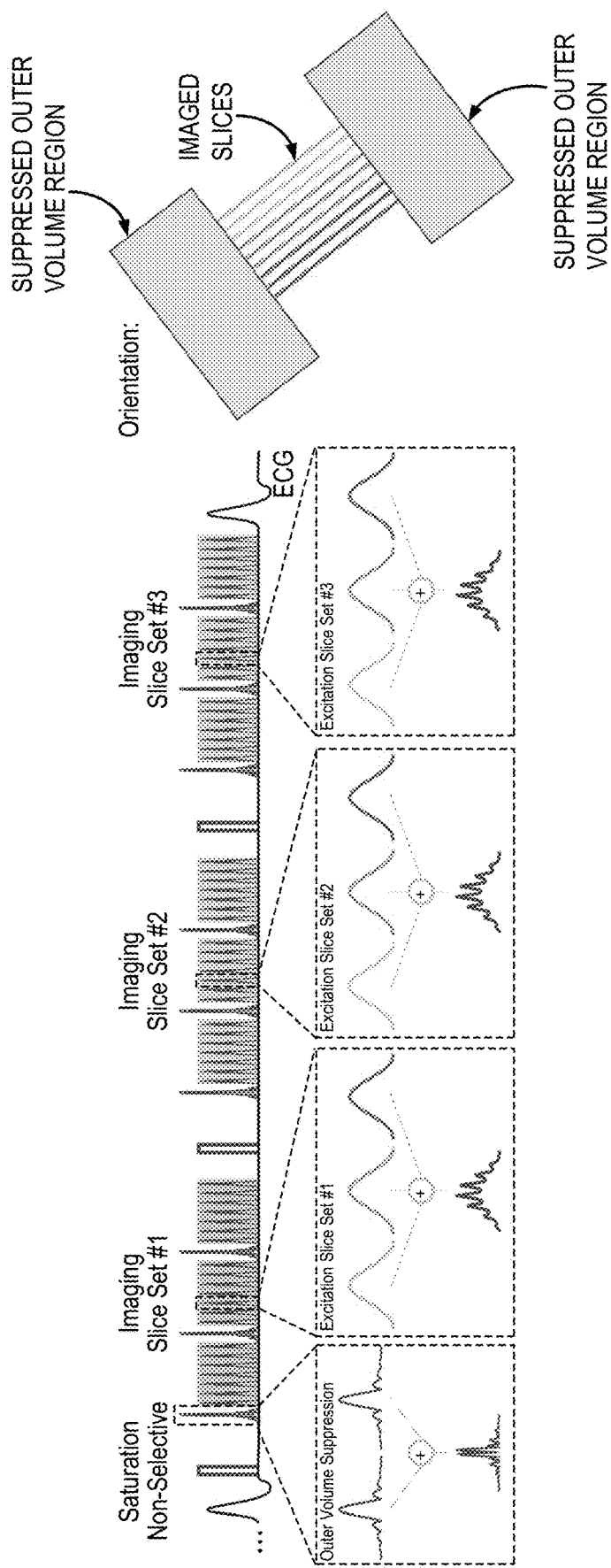
FIG. 3 is an example pulse sequence diagram that can be implemented for highly undersampled multiband perfusion imaging.

An example of an RF pulse sequence diagram of a highly undersampled multiband perfusion imaging sequence is shown in FIG. 3. In this example, the acquisition of a full left ventricle short-axis stack in a single heart-beat can be achieved by imaging at three different cardiac phases with three simultaneously acquired slices each. To achieve optimal acceleration potential, outer volume suppression was performed using multiband saturation slabs. These are interleaved with the imaging pulses to simultaneously saturate extra-cardiac tissue at both sides of the heart.

In one example study, imaging was performed at 3T. In-vivo first-pass perfusion imaging was performed with injection of 0.05 mmol/kg gadobutrol (Gadovist) at 4 mL/s, followed by a 10-mL saline flush. Three-fold MB acceleration, three-fold uniform in-plane acceleration, and partial-Fourier=7/8 were utilized for an overall 10-fold acceleration. MB-OVS preparation was interleaved between every 9 imaging pulses. The imaging parameters were: FOV=320× 320 mm$^2$, resolution=1.7×1.7 mm$^2$, slice-thickness=8 mm, TR/TE/FA=2.9 ms/1.7 ms/12 degrees, temporal resolution=163 ms, saturation time=150 ms. Three separate MB slice-stacks were acquired within each heart-beat, for a total of nine-slice coverage. A one-second reference low-resolution scan (6×6 mm$^2$) of three slices and at three cardiac phases, during free-breathing, was used to generate coil sensitivity profiles. Iterative non-linear reconstruction was performed for each MB slice using a $B_1^-$ weighted approach with in-plane total variation ("TV") regularization.

The methods described in the present disclosure thus enable, as one non-limiting example, a 10-fold acceleration acquisition of myocardial perfusion images with nine-slice coverage, 1.7 mm in-plane resolution, and a 163 ms temporal resolution, suggesting the total acquisition can be confined to less than 500 ms. Furthermore, the reconstruction technique used in the example described above only relies on spatial information, which avoids issues with temporal blurring or the need for motion compensation. It is contemplated that additional improvements in reconstruction quality and higher acceleration rates can be achieved by implementing other regularization techniques.

MB processing of Cartesian data has a simple characterization in terms of FOV/MB factor shifts in image space. Thus, the use of OVS has an intuitive interpretation, in removing extra-cardiac structure for reduced fold-over artifacts due to slice acceleration. While this also enables a simpler reconstruction framework, the linear ordering used in 2D Cartesian acquisitions may necessitate interleaving of the OVS pulses, limiting their duration. To obtain good signal suppression at a minimal pulse duration, the methods described in the present disclosure used an MB approach to excite multiple saturation slabs simultaneously. This simultaneous excitation allows its interleaving into the acquisition pulse train, while avoiding contrast disruption.

Figure 4:
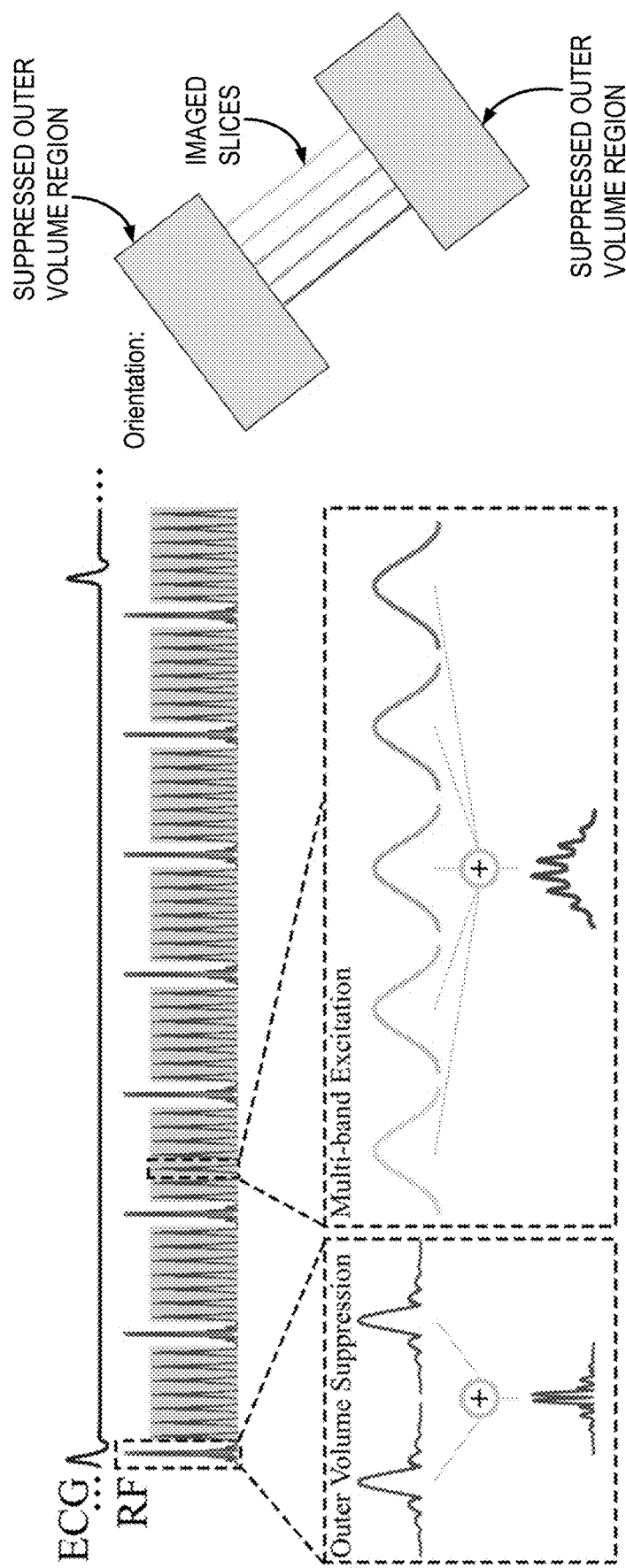
FIG. 4 is an example pulse sequence diagram that can be implemented for highly undersampled multiband cine imaging.

An example of an RF pulse sequence diagram of a highly undersampled multiband cine imaging sequence is shown in FIG. 4. In this example, slice excitation is performed with a multiband RF pulse obtained as the sum of five sinc-pulses at different center frequencies. It will be appreciated, however, that multiband RF pulses that simultaneously excite a different number of slices can also be implemented. This multiband RF excitation pulse is interleaved with a multiband saturation slab that simultaneously saturates two outer volume slabs. This multiband saturation pulse is interleaved with the imaging pulses to simultaneously saturate tissue in the outer volume slabs, which may be extra-cardiac tissue at both sides of the heart.

In one example study, imaging was performed at 3T. For a time-efficient protocol, cine images were acquired after contrast injection; however, it will be appreciated that imaging can also be performed without using a contrast agent. The following imaging parameters were employed in this example study: TR/TE/FA=4.3 ms/2.1 ms/12 degrees, FOV=320×320 mm$^2$, resolution=1.7×1.7 mm$^2$, slice thickness=6 mm, temporal resolution=41 ms, breath-hold duration=15-17 s, saturation slab=150 mm (each side, 2.4 ms assymmetric sinc), RF peak shift=15 percent.

This example pulse sequence implemented retrospectively-gated FLASH imaging. As noted above, SMS was enabled using an excitation pulse composed of the sum of multiple sinc-shape pulses with different center frequencies, to simultaneously excite multiple slice locations. To increase dissimilarity between slices, spatial shifts can be induced, as proposed in CAIPIRINHA, using variational phase cycling of the RF pulses for each slice. OVS was achieved using interleaved regional saturation pulses to saturate chest and back signals on both sides of the heart. To minimize the magnetization disruption induced by OVS pulses, both slabs were simultaneously saturated using a multiband saturation pulse.

Figure 5:
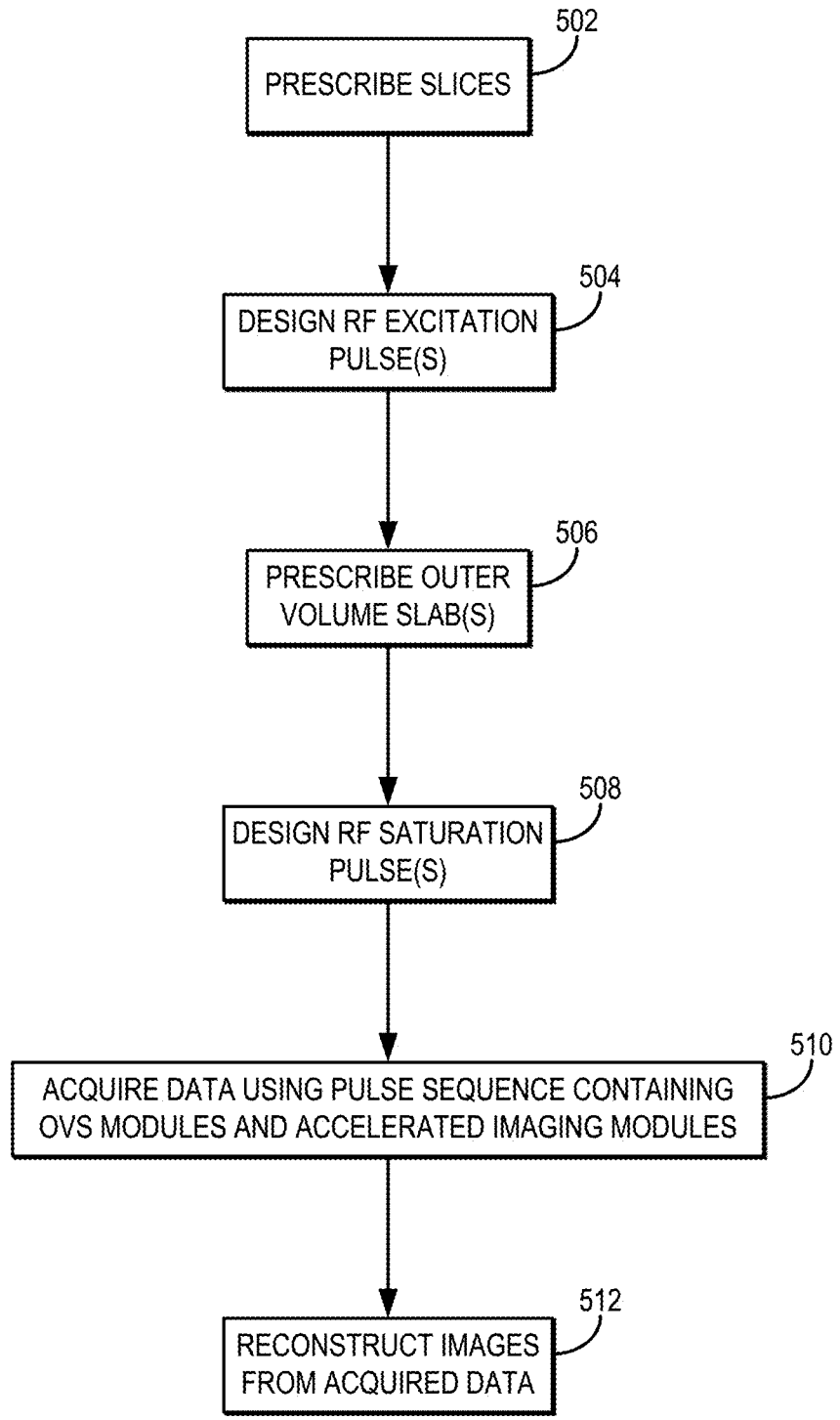
FIG. 5 is a flowchart setting forth the steps of an example method for imaging a subject with an MRI system implementing a pulse sequence that uses a combination of outer volume suppression and accelerated imaging.

Referring now to FIG. 5, a flowchart is illustrated as setting forth the steps of an example method for imaging a subject with an MRI system using a pulse sequence that implements a multiband OVS module and an accelerated imaging module, as described above. The method includes prescribing or otherwise selecting a plurality of slices in a subject from which data will be acquired, as indicated at step 502. Prescribing the slices can include selecting the locations of the slices using a graphical user interface on which a localizer or other image of the subject is displayed. Prescribing the slices can also include automatically selecting the locations of the slices based on a predetermined criterion or other automated process. One or more RF excitation pulses are then designed or otherwise selected based on the plurality of slices, as indicated at step 504.

The one or more RF excitation pulses generally include at least one multiband RF excitation pulse that provides for the simultaneous excitation of spins in two or more of the prescribed slices. In some examples, a single multiband RF pulse can be designed to simultaneously excite all of the prescribed slices. In other examples, a single multiband RF pulse can be used together with one or more additional RF pulses to excite the spins in the prescribed slices. The one or more additional RF pulses can include single band RF pulses or multiband RF pulses.

As one example, a plurality of multiband RF pulses can be designed or otherwise selected, such that each multiband RF pulse is designed to simultaneously excite spins in a different subset of the prescribed slices. In these instances, the different subsets of the prescribed slices can be interleaved with each other, or can be spatially contiguous groups.

The method also includes prescribing or otherwise selecting one or more outer volumes in which spins are to be saturated, as indicated at step 506. The one or more outer volumes can overlap with the prescribed slices. Preferably, the one or more outer volumes includes at least two outer volumes. One or more RF saturation pulses are then designed or otherwise selected based on the outer volumes, as indicated at step 508. The one or more RF saturation pulses generally include at least one multiband RF saturation pulse that provides for the simultaneous saturation of spins in two or more of the outer volumes. In some examples, a single multiband RF saturation pulse can be designed to simultaneously saturate all of the prescribed outer volumes.

The prescribed slices, RF excitation pulse(s), prescribed outer volumes, and RF saturation pulse(s) are then provided to the MRI system and are implemented in a pulse sequence to acquire data from the prescribed slices, as indicated at step 510. As described above, the pulse sequence includes an OVS module, in which the one or more RF saturation pulses are generated to saturate or otherwise suppress magnetic resonance signals from spins in the prescribed outer volumes. The OVS module is interleaved with an accelerated imaging module, in which the one or more RF excitation pulses are generated to excite spins in the prescribed slices.

In some implementations, the same slices are excited in each instance of the accelerated imaging module. An example of such an implementation is shown in FIG. 4. In other implementations, a different subset of the prescribed slices is excited in different instances of the accelerated imaging module. An example of such an implementation is shown in FIG. 3. As noted above, the accelerated imaging module generally includes accelerating the data acquisition along the slice encoding direction by implementing a simultaneous multislice acquisition. As one example, a CAIPIRINHA phase cycling scheme can be used in conjunction with one or more multiband RF excitation pulses. In other implementations, additional acceleration can be provided by in-plane k-space undersampling, such as by reducing the number of phase-encoding lines, using partial Fourier sampling, or so on.

After data are acquired from the prescribed slices, images are reconstructed from the acquired data, as indicated at step 512. The images can be reconstructed using an appropriate reconstruction algorithm. As one example a slice GRAPPA reconstruction can be used. As another example, a split slice GRAPPA reconstruction can be used. Still other examples include a SENSE reconstruction, a SPIRiT reconstruction, an ESPIRiT reconstruction, and other suitable parallel imaging reconstruction techniques and algorithms.

Figure 6:
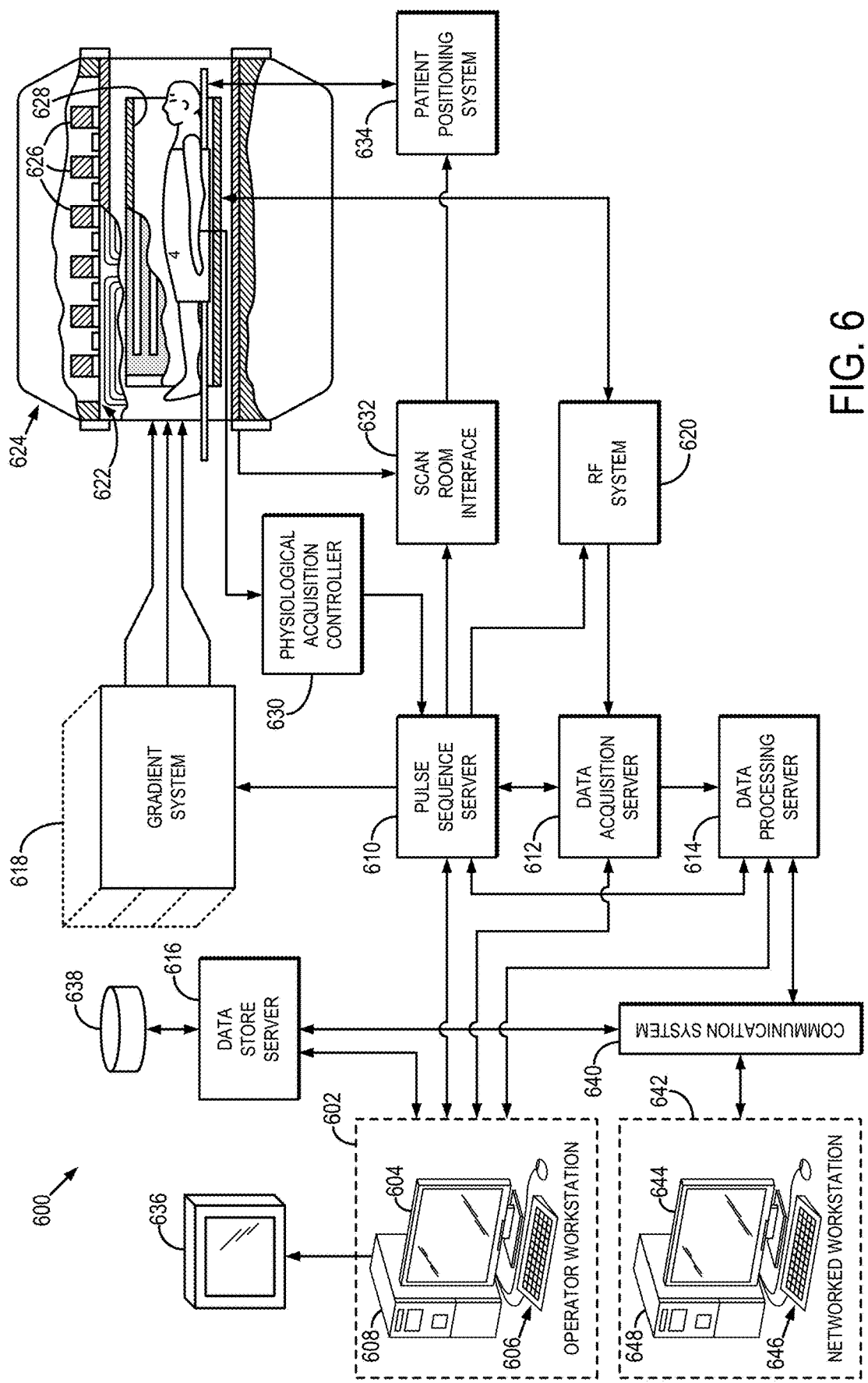
FIG. 6 is a block diagram of an example magnetic resonance imaging ("MRI") system that can implement the methods described in the present disclosure.

Referring particularly now to FIG. 6, an example of an MRI system 600 that can implement the methods described here is illustrated. The MRI system 600 includes an operator workstation 602 that may include a display 604, one or more input devices 606 (e.g., a keyboard, a mouse), and a processor 608. The processor 608 may include a commercially available programmable machine running a commercially available operating system. The operator workstation 602 provides an operator interface that facilitates entering scan parameters into the MRI system 600. The operator workstation 602 may be coupled to different servers, including, for example, a pulse sequence server 610, a data acquisition server 612, a data processing server 614, and a data store server 616. The operator workstation 602 and the servers 610, 612, 614, and 616 may be connected via a communication system 640, which may include wired or wireless network connections.

The pulse sequence server 610 functions in response to instructions provided by the operator workstation 602 to operate a gradient system 618 and a radiofrequency ("RF") system 620. Gradient waveforms for performing a prescribed scan are produced and applied to the gradient system 618, which then excites gradient coils in an assembly 622 to produce the magnetic field gradients $G_x$, $G_y$, and $G_z$ that are used for spatially encoding magnetic resonance signals. The gradient coil assembly 622 forms part of a magnet assembly 624 that includes a polarizing magnet 626 and a whole-body RF coil 628.

RF waveforms are applied by the RF system 620 to the RF coil 628, or a separate local coil to perform the prescribed magnetic resonance pulse sequence. Responsive magnetic resonance signals detected by the RF coil 628, or a separate local coil, are received by the RF system 620. The responsive magnetic resonance signals may be amplified, demodulated, filtered, and digitized under direction of commands produced by the pulse sequence server 610. The RF system 620 includes an RF transmitter for producing a wide variety of RF pulses used in MRI pulse sequences. The RF transmitter is responsive to the prescribed scan and direction from the pulse sequence server 610 to produce RF pulses of the desired frequency, phase, and pulse amplitude waveform. The generated RF pulses may be applied to the whole-body RF coil 628 or to one or more local coils or coil arrays.

The RF system 620 also includes one or more RF receiver channels. An RF receiver channel includes an RF preamplifier that amplifies the magnetic resonance signal received by the coil 628 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \tag{1}$$

and the phase of the received magnetic resonance signal may also be determined according to the following relationship:

$$\varphi = \tan^{-1}\left(\frac{Q}{I}\right). \tag{2}$$

The pulse sequence server 610 may receive patient data from a physiological acquisition controller 630. By way of example, the physiological acquisition controller 630 may receive signals from a number of different sensors connected to the patient, including electrocardiograph ("ECG") signals from electrodes, or respiratory signals from a respiratory bellows or other respiratory monitoring devices. These signals may be used by the pulse sequence server 610 to synchronize, or "gate," the performance of the scan with the subject's heart beat or respiration.

The pulse sequence server 610 may also connect to a scan room interface circuit 632 that receives signals from various sensors associated with the condition of the patient and the magnet system. Through the scan room interface circuit 632, a patient positioning system 634 can receive commands to move the patient to desired positions during the scan.

The digitized magnetic resonance signal samples produced by the RF system 620 are received by the data acquisition server 612. The data acquisition server 612 operates in response to instructions downloaded from the operator workstation 602 to receive the real-time magnetic resonance data and provide buffer storage, so that data is not lost by data overrun. In some scans, the data acquisition server 612 passes the acquired magnetic resonance data to the data processor server 614. In scans that require information derived from acquired magnetic resonance data to control the further performance of the scan, the data acquisition server 612 may be programmed to produce such information and convey it to the pulse sequence server 610. For example, during pre-scans, magnetic resonance data may be acquired and used to calibrate the pulse sequence performed by the pulse sequence server 610. As another example, navigator signals may be acquired and used to adjust the operating parameters of the RF system 620 or the gradient system 618, or to control the view order in which k-space is sampled. In still another example, the data acquisition server 612 may also process magnetic resonance signals used to detect the arrival of a contrast agent in a magnetic resonance angiography ("MRA") scan. For example, the data acquisition server 612 may acquire magnetic resonance data and processes it in real-time to produce information that is used to control the scan.

The data processing server 614 receives magnetic resonance data from the data acquisition server 612 and processes the magnetic resonance data in accordance with instructions provided by the operator workstation 602. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 614 are conveyed back to the operator workstation 602 for storage. Real-time images may be stored in a data base memory cache, from which they may be output to operator display 602 or a display 636. Batch mode images or selected real time images may be stored in a host database on disc storage 638. When such images have been reconstructed and transferred to storage, the data processing server 614 may notify the data store server 616 on the operator workstation 602. The operator workstation 602 may be used by an operator to archive the images, produce films, or send the images via a network to other facilities.

The MRI system 600 may also include one or more networked workstations 642. For example, a networked workstation 642 may include a display 644, one or more input devices 646 (e.g., a keyboard, a mouse), and a processor 648. The networked workstation 642 may be located within the same facility as the operator workstation 602, or in a different facility, such as a different healthcare institution or clinic.

The networked workstation 642 may gain remote access to the data processing server 614 or data store server 616 via the communication system 640. Accordingly, multiple networked workstations 642 may have access to the data processing server 614 and the data store server 616. In this manner, magnetic resonance data, reconstructed images, or other data may be exchanged between the data processing server 614 or the data store server 616 and the networked workstations 642, such that the data or images may be remotely processed by a networked workstation 642.

The present disclosure has described one or more preferred embodiments, and it should be appreciated that many equivalents, alternatives, variations, and modifications, aside from those expressly stated, are possible and within the scope of the invention.

The invention claimed is:

1. A method for acquiring images from multiple different slices in a subject using a magnetic resonance imaging (MRI) system, the steps of the method comprising:
   (a) controlling the MRI system to acquire data in a plurality of different slices in the subject using a multiband pulse sequence that includes:
   an outer volume suppression (OVS) module containing at least one multiband radio frequency (RF) pulse that suppresses magnetic resonance signals in one or more outer volume regions in the plurality of different slices;
   an accelerated imaging module containing at least one multiband RF excitation pulse performed after the OVS module, wherein the accelerated imaging module provides an accelerated data acquisition along at least one direction; and
   (b) reconstructing images of the plurality of slices from the acquired data.

2. The method as recited in claim 1, wherein the OVS module simultaneously suppresses magnetic resonance signals in the one or more outer volume regions in the plurality of different slices.

3. The method as recited in claim 2, wherein the at least one multiband radio frequency (RF) pulse that simultaneously saturates magnetic resonance signals in one or more outer volume regions is applied along a dimension that is aligned with a phase-encoding direction.

4. The method as recited in claim 1, wherein the at least one multiband RF pulse in the OVS module comprises at least one adiabatic RF pulse that suppresses magnetic resonance signals in one or more outer volume regions in the plurality of different slices.

5. The method as recited in claim 1, wherein the at least one multiband RF pulse in the OVS module comprises at least one non-selective adiabatic RF pulse that tips down magnetization in the plurality of different slices and at least one selective RF pulse that tips up magnetization in a central region of the plurality of different slices that excludes one or more outer volume regions.

6. The method as recited in claim 1, wherein the at least one multiband RF pulse in the OVS module comprises at least one spatially selective RF pulse and the at least one multiband RF excitation pulse in the accelerated imaging module includes at least one RF excitation pulse that is a non-selective RF excitation pulse.

7. The method as recited in claim 6, wherein the non-selective RF excitation pulse is an adiabatic non-selective RF excitation pulse.

8. The method as recited in claim 1, wherein the OVS module comprises a magnetization preparation module that contains at least one magnetization preparation RF pulse in addition to the at least one multiband radio frequency (RF) pulse that suppresses magnetic resonance signals in the one or more outer volume regions in the plurality of different slices.

9. The method as recited in claim 8, wherein the magnetization preparation RF pulse is a T2-preparation RF pulse.

10. The method as recited in claim 1, wherein the accelerated imaging module is a simultaneous multislice (SMS) imaging module having an accelerated data acquisition along a slice direction that simultaneously excites the plurality of different slices.

11. The method as recited in claim 10, wherein the accelerated imaging module is a parallel imaging module having an accelerated data acquisition along at least one in-plane direction by undersampling k-space along the at least one in-plane direction.

12. The method as recited in claim 1, wherein the accelerated imaging module is a compressed sensing imaging module having an accelerated data acquisition along the at least one direction by sparsely sampling a subset of k-space.

13. The method as recited in claim 12, wherein sparsely sampling the subset of k-space comprises randomly sampling the subset of k-space.

14. The method as recited in claim 12, wherein reconstructing the images includes using a compressed sensing algorithm.

15. The method as recited in claim 14, wherein the accelerated imaging module further comprises a simultaneous multislice (SMS) imaging module having an accelerated data acquisition along a slice direction by containing at least one multiband RF excitation pulse that simultaneously excites the plurality of different slices.

16. The method as recited in claim 1, wherein the pulse sequence comprises interleaving the OVS module and the accelerated imaging module for a plurality of repetitions.

17. The method as recited in claim 1, wherein reconstructing the images includes using a parallel image reconstruction algorithm.

18. The method as recited in claim 17, wherein the parallel image reconstruction algorithm includes an algorithm based at least in part on one of a sensitivity encoding (SENSE) or generalized autocalibrating partial parallel acquisition (GRAPPA).

19. The method as recited in claim 1, wherein controlling the MRI system to acquire data in a plurality of different slices includes simultaneously acquiring at least a first slice and a second slice.

20. The method as recited in claim 19, wherein the at least one multiband RF pulse in the OVS module suppresses magnetic resonance signals in one or more outer volume regions of each of the first slice and the second slice and is configured such the suppressed magnetic resonance signals in the one or more outer volume regions of the second slice are aliased into a region-of-interest (ROI) of the first slice, and the suppressed magnetic resonance signals in the one or more outer volume regions of the first slice are aliased into an ROI of the second slice.

\* \* \* \* \*